United States Patent
Song et al.

(10) Patent No.: US 9,502,081 B2
(45) Date of Patent: Nov. 22, 2016

(54) INTERNAL VOLTAGE GENERATING CIRCUIT FOR GENERATING INTERNAL VOLTAGE ACCORDING TO TEMPERATURE AND PROCESS VARIATION

(71) Applicant: SK hynix Inc., Icheon-si Gyeonggi-do (KR)

(72) Inventors: Ho Uk Song, Icheon-si (KR); A Ram Rim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/723,749

(22) Filed: May 28, 2015

(65) Prior Publication Data

US 2016/0254034 A1 Sep. 1, 2016

(30) Foreign Application Priority Data

Feb. 27, 2015 (KR) .................. 10-2015-0028345

(51) Int. Cl.
*G11C 7/04* (2006.01)
*G11C 5/14* (2006.01)

(52) U.S. Cl.
CPC .................................. *G11C 5/147* (2013.01)

(58) Field of Classification Search
USPC ................................... 365/189.09, 211, 226
See application file for complete search history.

(56) References Cited

U.S. PATENT DOCUMENTS

| 7,609,195 | B2* | 10/2009 | Jeong | G01K 7/015 365/211 |
|---|---|---|---|---|
| 7,817,483 | B2* | 10/2010 | Choi | G06F 11/1032 365/211 |
| 7,969,795 | B2* | 6/2011 | Lee | G11O 5/145 365/211 |
| 8,238,185 | B2* | 8/2012 | Lee | G11O 5/143 365/211 |
| 8,625,375 | B2* | 1/2014 | Kim | G11C 7/04 365/211 |
| 8,659,966 | B2* | 2/2014 | Choi | G11C 7/04 365/211 |
| 9,013,932 | B1* | 4/2015 | Lee | G11C 11/40626 365/211 |
| 9,064,545 | B2* | 6/2015 | Cho | G11C 16/0483 |

FOREIGN PATENT DOCUMENTS

KR 1020090106151 A 10/2009
KR 1020100002642 A 1/2010

* cited by examiner

*Primary Examiner* — Trong Phan
(74) *Attorney, Agent, or Firm* — William Park & Associates Ltd.

(57) ABSTRACT

An internal voltage generation circuit may include a temperature information generation unit configured to generate a temperature code having a code value corresponding to a temperature. The temperature information generation unit may include a process variation information generation unit configured to generate a process code having a code value corresponding to a process variation. The temperature information generation unit may include a code combination unit configured to generate a combination code in response to a ratio control signal, the temperature code, and the process code. The temperature information generation unit may include an internal voltage generation unit configured to generate an internal voltage having a voltage level corresponding to a code value of the combination code.

15 Claims, 6 Drawing Sheets

FIG.5

Result Table By Decoding Of 1st Decoding Unit

| temp_code<0> | temp_code<1> | ROD_code<0> | ROD_code<1> | D_code1<0:3> |
|---|---|---|---|---|
| 0 | 0 | 0 | 0 | 1000 |
| 0 | 0 | 0 | 1 | 1010 |
| 0 | 0 | 1 | 0 | 0110 |
| 0 | 0 | 1 | 1 | 1000 |
| 0 | 1 | 0 | 0 | 1010 |
| 0 | 1 | 0 | 1 | 1100 |
| 0 | 1 | 1 | 0 | 1000 |
| 0 | 1 | 1 | 1 | 1010 |
| 1 | 0 | 0 | 0 | 0110 |
| 1 | 0 | 0 | 1 | 1000 |
| 1 | 0 | 1 | 0 | 0100 |
| 1 | 0 | 1 | 1 | 0110 |
| 1 | 1 | 0 | 0 | 1000 |
| 1 | 1 | 0 | 1 | 1010 |
| 1 | 1 | 1 | 0 | 0110 |
| 1 | 1 | 1 | 1 | 1000 |

Result Table By Decoding Of 2nd Decoding Unit

| temp_code<0> | temp_code<1> | ROD_code<0> | ROD_code<1> | D_code2<0:3> |
|---|---|---|---|---|
| 0 | 0 | 0 | 0 | 1000 |
| 0 | 0 | 0 | 1 | 1001 |
| 0 | 0 | 1 | 0 | 0111 |
| 0 | 0 | 1 | 1 | 1000 |
| 0 | 1 | 0 | 0 | 1010 |
| 0 | 1 | 0 | 1 | 1011 |
| 0 | 1 | 1 | 0 | 1001 |
| 0 | 1 | 1 | 1 | 1010 |
| 1 | 0 | 0 | 0 | 0110 |
| 1 | 0 | 0 | 1 | 0111 |
| 1 | 0 | 1 | 0 | 0101 |
| 1 | 0 | 1 | 1 | 0110 |
| 1 | 1 | 0 | 0 | 1000 |
| 1 | 1 | 0 | 1 | 1001 |
| 1 | 1 | 1 | 0 | 0111 |
| 1 | 1 | 1 | 1 | 1000 |

FIG.6

Change Of Internal Voltage Level Depending On Combination Code (C_code)

| Internal Voltage Level V_int | C_code<0:3> |
|---|---|
| 210mV | 0001 |
| 180mV | 0010 |
| 150mV | 0011 |
| 120mV | 0100 |
| 90mV | 0101 |
| 60mV | 0110 |
| 30mV | 0111 |
| Set Level (Initial Value) | 1000 |
| 30mV | 1001 |
| 60mV | 1010 |
| 90mV | 1011 |
| 120mV | 1100 |
| 150mV | 1101 |
| 180mV | 1110 |
| 210mV | 1111 |

INTERNAL VOLTAGE GENERATING CIRCUIT FOR GENERATING INTERNAL VOLTAGE ACCORDING TO TEMPERATURE AND PROCESS VARIATION

CROSS-REFERENCES TO RELATED APPLICATION

The present application claims priority under 35 U.S.C. §119(a) to Korean application number 10-2015-0028345, filed on Feb. 27, 2015, in the Korean Intellectual Property Office, which is incorporated herein by reference in its entirety.

BACKGROUND

1. Technical Field

Various embodiments generally relate to a semiconductor integrated circuit, and more particularly, to an internal voltage generating circuit.

2. Related Art

A semiconductor device may receive a voltage applied from an exterior to the semiconductor device. With the received voltage the semiconductor device may generate voltages having necessary voltage levels to conduct various operations within the semiconductor device. In this case, the voltages generated in the inside of the semiconductor device are referred to as internal voltages, and a circuit for generating the internal voltages are referred to as an internal voltage generating circuit.

Generally, a semiconductor device reacts sensitively to a change in a process for manufacturing the semiconductor device and to a change in temperature.

SUMMARY

In an embodiment, there may be provided an internal voltage generating circuit. The internal voltage generating circuit may include a temperature information generation unit configured to generate a temperature code having a code value corresponding to a temperature. The voltage generating circuit may include a process variation information generation unit configured to generate a process code having a code value corresponding to a process variation. The voltage generating circuit may include a code combination unit configured to generate a combination code in response to a ratio control signal, the temperature code, and the process code. The voltage generating circuit may include an internal voltage generation unit configured to generate an internal voltage having a voltage level corresponding to a code value of the combination code.

In an embodiment, there may be provided an internal voltage generating circuit. The internal voltage generating circuit may include a code combination unit configured to generate a combination code in response to a temperature code and a process code, the temperature code and the process code having code values corresponding to temperature variation and process variation, respectively. The internal voltage generating circuit may include an internal voltage generation unit configured to generate an internal voltage having a voltage level corresponding to a code value of the combination code.

BRIEF DESCRIPTION OF THE DRAWINGS

FIGS. 5 and 6 are tables explaining a representation of an example of an internal voltage generating circuit in accordance with an embodiment.

DETAILED DESCRIPTION

Hereinafter, examples of an internal voltage generating circuit according to the present disclosure will be described below with reference to the accompanying drawings through various embodiments.

Figure 1:
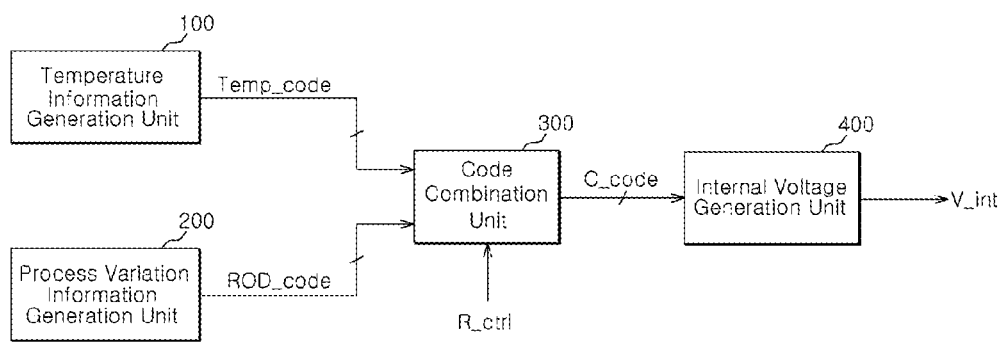
FIG. 1 is a block diagram illustrating a representation of an example of the configuration of an internal voltage generating circuit in accordance with an embodiment.

In accordance with an embodiment, referring to FIG. 1, an internal voltage generating circuit may include a temperature information generation unit 100, a process variation information generation unit 200, a code combination unit 300, and an internal voltage generation unit 400.

Figure 2:
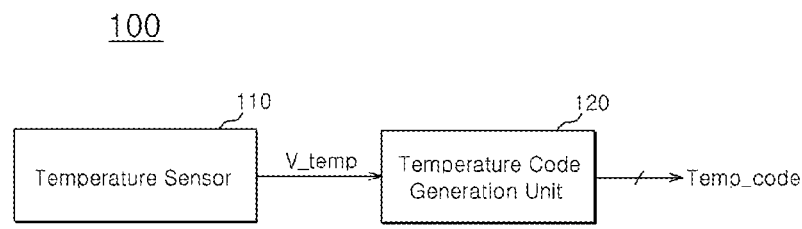
FIG. 2 is a block diagram illustrating a representation of an example of the configuration of a code combination unit capable of being implemented in the circuit of FIG. 1 according to an embodiment.

The temperature information generation unit 100 may generate a temperature code Temp_code. The temperature code Temp_code may have a code value corresponding to a temperature. For example, referring to FIG. 2, the temperature information generation unit 100 may include a temperature sensor 110. The temperature sensor 110 may be configured to generate a temperature voltage V_temp. The temperature voltage V_temp may have a voltage level corresponding to a temperature. The temperature information generation unit 100 may include a temperature code generation unit 120. The temperature code generation unit 120 may be configured to generate the temperature code Temp_code corresponding to the voltage level of the temperature voltage V_temp.

Figure 3:
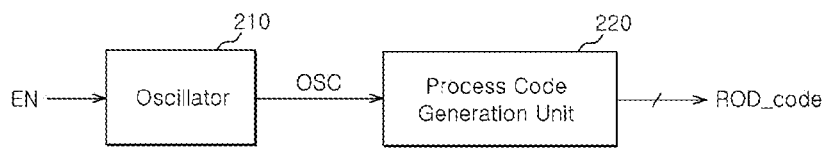
FIG. 3 is a block diagram illustrating a representation of an example of the configuration of a temperature information generation unit capable of being implemented in the circuit of FIG. 1 according to an embodiment.

The process variation information generation unit 200 may generate a process code ROD_code. The process code may have a code value corresponding to a variation in a semiconductor manufacturing process. For example, referring to FIG. 3, the process variation information generation unit 200 may include an oscillator 210. The oscillator 210 may be configured to generate an oscillator signal OSC during an enable section of an enable signal EN. The enable signal EN may be received by the oscillator 210. The process variation information generation unit 200 may include a process code generation unit 220. The process code generation unit 220 may be configured to count the oscillator signal OSC and to generate the process code ROD_code. The operation of the process variation information generation unit 200 will now be described below. The oscillator 210 may generate an oscillator signal OSC having a frequency. The frequency of the oscillator signal OSC may vary depending on process variations. Such an oscillator signal OSC may be counted during an equal time (i.e. during an enable section of the enable signal EN), and thereby, the process code ROD_code may be generated. Therefore, the process code ROD_code having a code value corresponding to each process variation can be generated. In addition, since the threshold voltage of a transistor varies depending to process variations, the oscillator 210 configured to include transistor may generate an oscillator signal OSC having a lower frequency as the threshold voltage becomes higher, and generate an oscillator signal OSC having a higher frequency as the threshold voltage becomes lower. Thus, the oscillator 210 can generate the oscillator signal OSC having a frequency, and the frequency of the oscillator signal OCS may vary depending to process variations.

The code combination unit 300 may receive the temperature code Temp_code, the process code ROD_code, and a ratio control signal R_ctrl. The code combination unit 300 may generate a combination code C_code by combining the temperature code Temp_code and the process code ROD_code according to a ratio control signal R_ctrl. For example, when the ratio control signal R_ctrl is enabled, the code combination unit 300 may generate the combination code C_code having a code value which is different from that when the ratio control signal R_ctrl is disabled.

Figure 4:
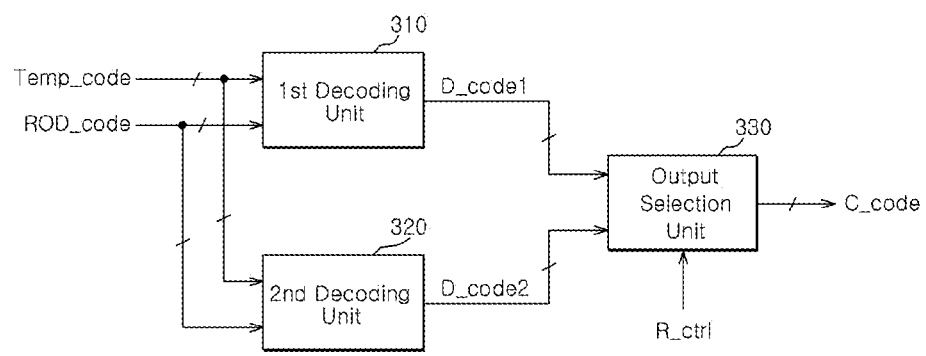
FIG. 4 is a block diagram illustrating a representation of an example of the configuration of a process variation information generation unit capable of being implemented in the circuit of FIG. 1 according to an embodiment.

Referring to FIG. 4, the code combination unit 300 may include a first decoding unit 310, a second decoding unit 320, and an output selection unit 330.

The first decoding unit 310 may decode the temperature code Temp_code and the process code ROD_code. The first decoding unit 310 may generate a first decoding signal D_code1.

The second decoding unit 320 may decode the temperature code Temp_code and the process code ROD_code. The second decoding unit 320 may generate a second decoding signal D_code2. In this example, the first decoding unit 310 and the second decoding unit 320 may be configured to use mutually different decoding schemes. For example, the first decoding signal D_code1 and the second decoding signal D_code2 may have mutually different code values.

The output selection unit 330 may output one of the first and second decoding codes D_code1 and D_code2 as the combination code C_code. The output selection unit 330 may output one of the first and second decoding codes D_code1 and D_code2 as the combination code C_code in response to the ratio control signal R_ctrl. For example, the output selection unit 330 may output the first decoding code D_code 1 as the combination code C_code when the ratio control signal R_ctrl is disabled. For example, the output selection unit 330 may output the second decoding code D_code2 as the combination code C_code when the ratio control signal R_ctrl is enabled.

The internal voltage generation unit 400 may generate an internal voltage V_int. The internal voltage V_int may have a voltage level corresponding to the combination code C_code. In this example, the internal voltage V_int is representative of all voltages used within a semiconductor device.

The operation of the internal voltage generating circuit configured as above in accordance with an example of an embodiment will be described below with reference to FIGS. 5 and 6.

The temperature information generation unit 100 may generate a temperature code Temp_code having a code value corresponding to a temperature. The temperature code Temp_code generated as above is illustrated and described as a temperature code Temp_code<0:1> configured with two bits in FIG. 5. However, such a configuration is just one example of an embodiment, and the temperature code Temp_code is not limited thereto and may be more or less than two bits etc. A cold temperature is indicated when only the first bit Temp_code<0> of the temperature code Temp_code<0:1> is at a high level "1". A hot temperature is indicated when only the second bit Temp_code<1> of the temperature code Temp_code<0:1> is at a high level "1". A normal temperature is indicated when both bits of the temperature code Temp_code<0:1> are at an equal level. In this example, the cold temperature represents a temperature lower than the normal temperature, and the hot temperature represents a temperature higher than the normal temperature The process variation information generation unit 200 may generate a process code ROD_code having a code value corresponding to a process variation. The process code ROD_code generated as above is illustrated and described as a process code ROD_code<0:1> configured with two bits in FIG. 5. However, such a configuration is just one example of an embodiment, and the process code ROD_code is not limited thereto and may be more or less than two bits etc. When only the first bit ROD_code<0> of the process code ROD_code<0:1> is at a high level "1", it means that the semiconductor device is at a high operating speed due to a process variation. When only the second bit ROD_code<1> of the process code ROD_code<0:1> is at a high level "1", it means that the semiconductor device is at a low operating speed due to a process variation. When both bits of the process code ROD_code<0:1> are at an equal level, it means a normal operating speed. In this example, the high operating speed represents a speed higher than the normal operating speed, and the low operating speed represents a speed lower than the normal operating speed.

The example of results obtained by decoding the temperature code Temp_code<0:1> and the process code ROD_code<0:1> are illustrated in FIG. 5.

Referring to FIG. 4, the result of the decoding by the first decoding unit 310 is as follows. According to variations of the temperature code Temp_code<0:1> and the process code ROD_code<0:1>, the code value of a first decoding code D_code1<0:3> may be changed from the code value "1000" of the first decoding code D_code1<0:3>, which is an initial value, two by two in the decimal system. More specifically, the code value "1000" of the first decoding code D_code1<0:3>, which is the initial value, may increase or decrease two by two in the decimal system or may be maintained depending on the temperature code Temp_code<0:1>; and the code value the first decoding code D_code1<0:3> changed by the temperature code Temp_code<0:1> may additionally increase or decrease two by two in the decimal system or may be maintained depending on the process code ROD_code<0:1>. Referring to the tables, the code value "1000" of the first decoding code D_code1<0:3>, which is the initial value, may increase to "1010", or may be maintained at "1000", or may decrease to "0110" depending on the temperature code Temp_code<0:1>. When the code value of the first decoding code D_code1<0:3> is maintained at "1000" depending on the temperature code Temp_code<0:1>, the first decoding code D_code1<0:3> may increase to "1010", or may be maintained at "1000", or may decrease to "0110" depending on the process code ROD_code<0:1>. In addition, when the code value of the first decoding code D_code1<0:3> is changed to "1010" depending on the temperature code Temp_code<0:1>, the first decoding code D_code1<0:3> may increase to "1100", or may be maintained at "1010", or may decrease to "1000" depending on the process code ROD_code<0:1>.

Referring to FIG. 4, the result of the decoding by the second decoding unit 320 is as follows. The code value of the second decoding code D_code2<0:3> may increase or decrease, from the code value "1000" of the second decoding code D_code2<0:3> which is an initial value, two by two in the decimal system or may be maintained depending on the temperature code Temp_code<0:1>; and the code value the second decoding code D_code2<0:3> changed by the temperature code Temp_code<0:1> may additionally increase or decrease one by one in the decimal system or may be maintained depending on the process code ROD_code<0:1>. For example, when the code value "1000" of the second decoding code D_code2<0:3> having the initial value increases to "1010" depending on the temperature code Temp_code<0:1>, the second decoding code D_code2<0:3> may increase to "1011", or may decrease to "1001", or may be maintained at "1010" depending on the process code ROD_code<0:1>.

Consequently, the temperature code Temp_code<0:1> and the process code ROD_code<0:1> can vary the first decoding code D_code 1<0:3> at an equivalent ratio of 1:1. In addition, the temperature code Temp_code<0:1> and the process code ROD_code<0:1> can vary the second decoding code D_code2<0:3> at a non-equivalent ratio of 2:1.

One of the first decoding code D_code 1<0:3> and second decoding code D_code2<0:3>, which have generated as above, may be outputted as a combination code C_code<0:3>, as illustrated in FIG. 6, by the ratio control signal R_ctrl.

The internal voltage generation unit 400, illustrated in FIG. 1, varies the voltage level of the internal voltage V_int depending on the combination code C_code. FIG. 6 is a table illustrating an example in which the combination code C_code<0:3> is configured with, for example, four bits.

When the code value of the combination code C_code<0:3> is "1000", the internal voltage V_int may have a voltage level set as an initial value.

Whenever the code value of the combination code C_code<0:3> decreases by one, the voltage level of the internal voltage V_int may decrease by, for example but not limited to, 30 mV. In addition, whenever the code value of the combination code C_code<0:3> increases by one, the voltage level of the internal voltage V_int may increase by, for example but not limited to, 30 mV.

A change in the voltage level of the internal voltage V_int will now be described with reference to FIGS. 5 and 6.

For example, when the first decoding code D_code 1<0:3> is selected and outputted as the combination code C_code<0:3>, the voltage level of the internal voltage V_int may be changed in units of 60 mV. For example, when the second decoding code D_code 2<0:3> is selected and outputted as the combination code C_code<0:3>, the voltage level of the internal voltage V_int may be changed in units of 60 mV or 30 mV.

As described above, according to the internal voltage generating circuit in accordance with an embodiment, it may be possible to vary the voltage level of the internal voltage using temperature information and process variation information. A degree of influence of temperature information and process variation information exerted on the voltage level of the internal voltage may be controlled according to a ratio control signal.

The code combination unit 300 illustrated in FIG. 4 illustrates, for example, a technique for generating a combination code C_code using two decoding units 310 and 320, which use two mutually different decoding schemes (in a ratio at which temperature information and process variation information exert an effect on the combination code).

Figure 7:
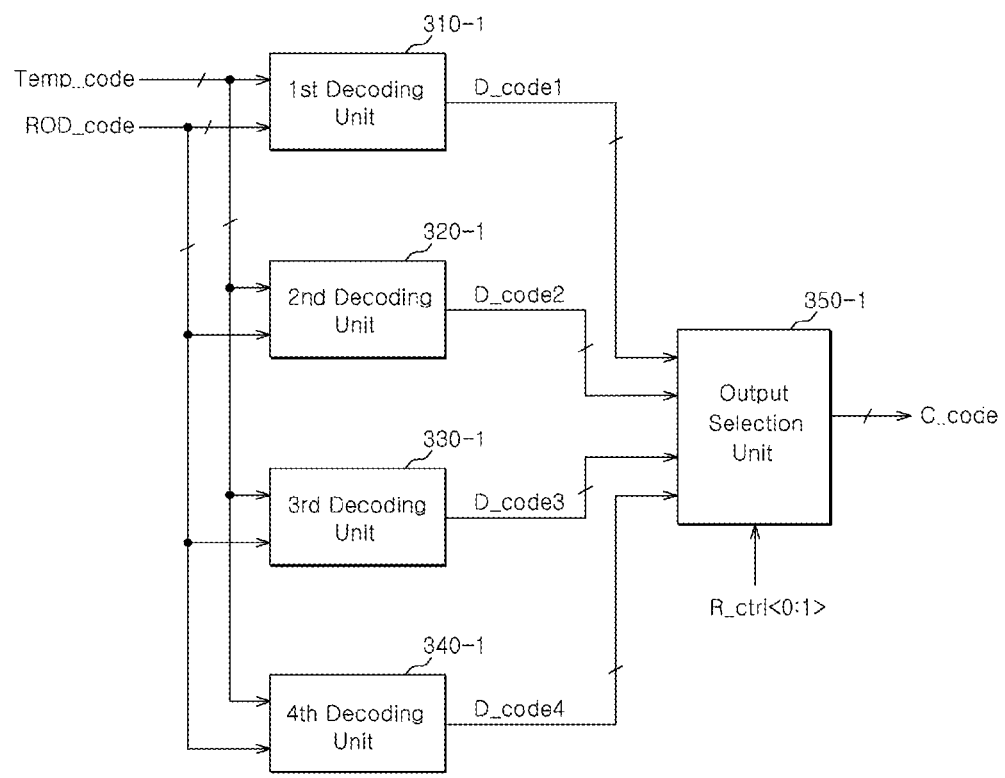
FIG. 7 is a block diagram illustrating a representation of an example of the configuration of a code combination unit capable of being implemented in the circuit of FIG. 1 according to an embodiment.

A code combination unit 300-1 illustrated in FIG. 7 illustrates an example of a technique for generating a combination code C_code using four decoding units 310-1, 320-1, 330-1 and 340-1. The four decoding units 310-1, 320-1, 330-1 and 340-1 use, for example, four mutually different decoding schemes, respectively (in a ratio at which temperature information and process variation information exert an effect on the combination code). The first to fourth decoding units 310-1, 320-1, 330-1 and 340-1 may generate first to fourth decoding codes D_code1, D_code2, D_code3 and D_code4, respectively, by decoding a temperature code Temp_code and a process code ROD_code in mutually different schemes. The output selection unit 350-1 may output one of the first to fourth decoding codes D_code1, D_code2, D_code3 and D_code4 as a combination code C_code in response to a ratio control signal R_ctrl<0:1>. The code combination unit 300-1 illustrated in FIG. 7 may be substituted by the code combination unit 300 illustrated in FIG. 4.

Figure 8:
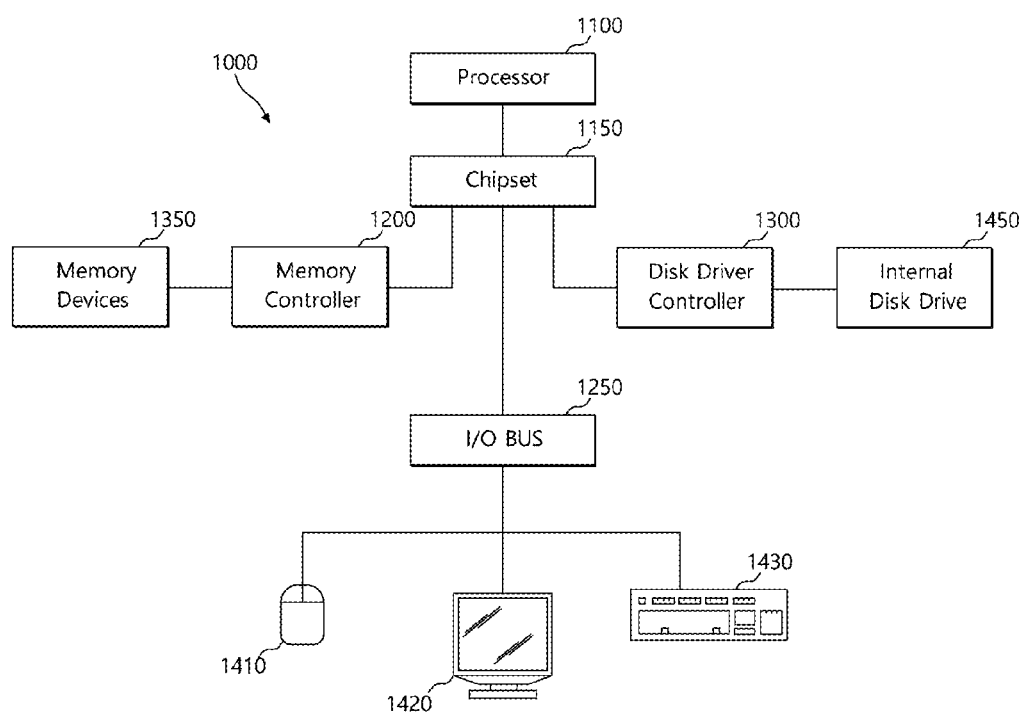
FIG. 8 illustrates a block diagram of an example of a representation of a system employing an internal voltage generating circuit in accordance with the various embodiments discussed above with relation to FIGS. 1-7.

The internal voltage generating circuits discussed above (see FIGS. 1-7) are particular useful in the design of memory devices, processors, and computer systems. For example, referring to FIG. 8, a block diagram of a system employing an internal voltage generating circuit in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one internal voltage generating circuit as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one internal voltage generating circuit as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing an internal voltage generating circuit as discussed above with relation to FIGS. 1-7. In alternate embodiments, such as cellular phones or digital cameras, the components may differ from the embodiments illustrated in FIG. 8.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. An internal voltage generating circuit comprising:
   a temperature information generation unit configured to generate a temperature code having a code value corresponding to a temperature;
   a process variation information generation unit configured to generate a process code having a code value corresponding to a process variation;
   a code combination unit configured to generate a combination code in response to a ratio control signal, the temperature code, and the process code; and
   an internal voltage generation unit configured to generate an internal voltage having a voltage level corresponding to a code value of the combination code.

2. The circuit according to claim 1, wherein the temperature information generation unit comprises:
   a temperature sensor configured to generate a temperature voltage having a voltage level corresponding to a temperature; and
   a temperature code generation unit configured to generate the temperature code having a code value corresponding to the voltage level of the temperature voltage.

3. The circuit according to claim 1, wherein the process variation information generation unit comprises:
   an oscillator configured to generate an oscillator signal in response to an enable signal; and
   a process code generation unit configured to receive the oscillator signal and to generate the process code.

4. The circuit according to claim 3, wherein:
   the oscillator is configured to generate the oscillator signal during an enable section of the enable signal; and
   the process code generation unit is configured to count the oscillator signal and to generate the process code.

5. The circuit according to claim 1, wherein the code combination unit is configured to vary the combination code at an equivalent ratio with respect to a change of the temperature code and a change of the process code in response to the ratio control signal.

6. The circuit according to claim 1, wherein the code combination unit is configured to vary the combination code at a non-equivalent ratio with respect to a change of the temperature code and a change of the process code in response to the ratio control signal.

7. The circuit according to claim 1, wherein the code combination unit comprises:
   a first decoding unit configured to generate a first decoding code in response to the temperature code and the process code;
   a second decoding unit configured to generate a second decoding code in response to the temperature code and the process code; and
   an output selection unit configured to output one of the first and second decoding codes as the combination code in response to the ratio control signal.

8. The circuit according to claim 7, wherein the first decoding unit and the second decoding unit use mutually different decoding schemes.

9. The circuit according to claim 7, wherein the first decoding code and the second decoding code have mutually different code values.

10. An internal voltage generating circuit comprising:
    a code combination unit configured to generate a combination code by decoding a temperature code and a process code, the temperature code and the process code having code values corresponding to temperature variation and process variation, respectively; and
    an internal voltage generation unit configured to generate an internal voltage having a voltage level corresponding to a code value of the combination code.

11. The circuit according to claim 10, wherein the code combination unit is configured to generate the combination code in a decoding scheme in which the combination code varies at an equivalent ratio with respect to the temperature code and the process code.

12. The circuit according to claim 10, wherein the code combination unit is configured to generate the combination code in a decoding scheme in which the combination code varies at a non-equivalent ratio with respect to the temperature code and the process code.

13. The circuit according to claim 10, wherein the code combination unit comprises:
    a first decoding unit configured to vary a first decoding code at a first ratio with respect to the temperature code and the process code;
    a second decoding unit configured to vary a second decoding code at a second ratio with respect to the temperature code and the process code; and
    an output selection unit configured to output one of the first and second decoding codes as the combination code in response to a ratio control signal.

14. The circuit according to claim 13, wherein the first ratio is different from the second ratio.

15. The circuit according to claim 13, wherein the first ratio is an equivalent ratio and the second ratio is a non-equivalent ratio.

* * * * *